US 6,424,198 B1

(12) United States Patent
Wolford

(10) Patent No.: US 6,424,198 B1
(45) Date of Patent: Jul. 23, 2002

(54) MEMORY CLOCK GENERATION WITH CONFIGURABLE PHASE ADVANCE AND DELAY CAPABILITY

(75) Inventor: Barry Joe Wolford, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/925,260

(22) Filed: Aug. 9, 2001

(51) Int. Cl.[7] .................................................. G06F 1/04
(52) U.S. Cl. ........................ 327/291; 327/277; 327/161
(58) Field of Search ................................. 327/276, 141, 327/151, 160, 158, 279, 291, 277, 161

(56) References Cited

U.S. PATENT DOCUMENTS 6,067,648 A * 5/2000 Hunter et al. ................ 327/170
6,334,174 B1 * 12/2001 Delp et al. ................... 365/194

* cited by examiner

*Primary Examiner*—Kenneth B. Wells
*Assistant Examiner*—Cassandra Cox
(74) *Attorney, Agent, or Firm*—Carr Law Firm, L.L.P.; Robert M. Carwell

(57) ABSTRACT

A circuit generating memory clock with phase advance and delay capability is provided. The phase of the memory clock is controlled by adjusting the configuration register bits. The circuit allows for a high degree of control and flexibility in the memory clock generation in that the memory clock relationship with respect to the memory command and data can be adjusted independently, thereby creating the ability to effectively adjust the memory interface timings such as setup time, hold time, and memory read data access time. Specifically, 0, 90, and 180 degree phase advance ability is combined with the ability to add delay in fine increments to achieve a more granular degree of phase adjustment.

22 Claims, 2 Drawing Sheets

MEMORY CLOCK GENERATION WITH CONFIGURABLE PHASE ADVANCE AND DELAY CAPABILITY

BACKGROUND OF THE INVENTION

1. Field of the Invention

The invention relates generally to memory clock generation and, more particularly, to memory clock generation with configurable phase advance and delay capability.

2. Description of the Related Art

Memory clock generation is a critical component of a memory subsystem implementation and affects the overall memory interface timing budget. The memory subsystem clock generation and timing is particularly critical for existing memory technologies such as synchronous dynamic random access memory (SDRAM) and static random access memory (SRAM), and more so for emerging memory technologies, such as double data rate (DDR) SDRAM and quad data rate (QDR) SRAM, that employ source synchronous clocking schemes.

Conventionally, memory clock adjustment support has been designed into the system board using fixed wire delay schemes to add or remove delay on the order of hundreds of pico seconds. However, this method is not flexible enough to allow the user to compensate for board deficiencies and make a broader range of adjustments, given the strict timing requirements of emerging memory technologies such as DDR SDRAM and QDR SRAM.

Therefore, there is a need for a high degree of control and flexibility in the memory clock generation such that the memory-clock relationship, with respect to the memory command and data, can be adjusted independently, thereby creating the ability to effectively adjust the memory interface timings such as setup time, hold time and memory read data access time.

SUMMARY OF THE INVENTION

The present invention provides a memory clock generation logic circuit comprising a configuration register including desired phase shift and time delay values, and circuitry for applying those values to a synchronization signal. The synchronization signal is shifted 0-, 90-, 180-, or 270-degrees according to the desired phase shift value. Additionally, the synchronization signal is delayed according to the desired time delay value. The combination of the phase shifting and the time delaying provides a method and an apparatus that allow for the fine tuning of the synchronization signal.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION

Figure 1:
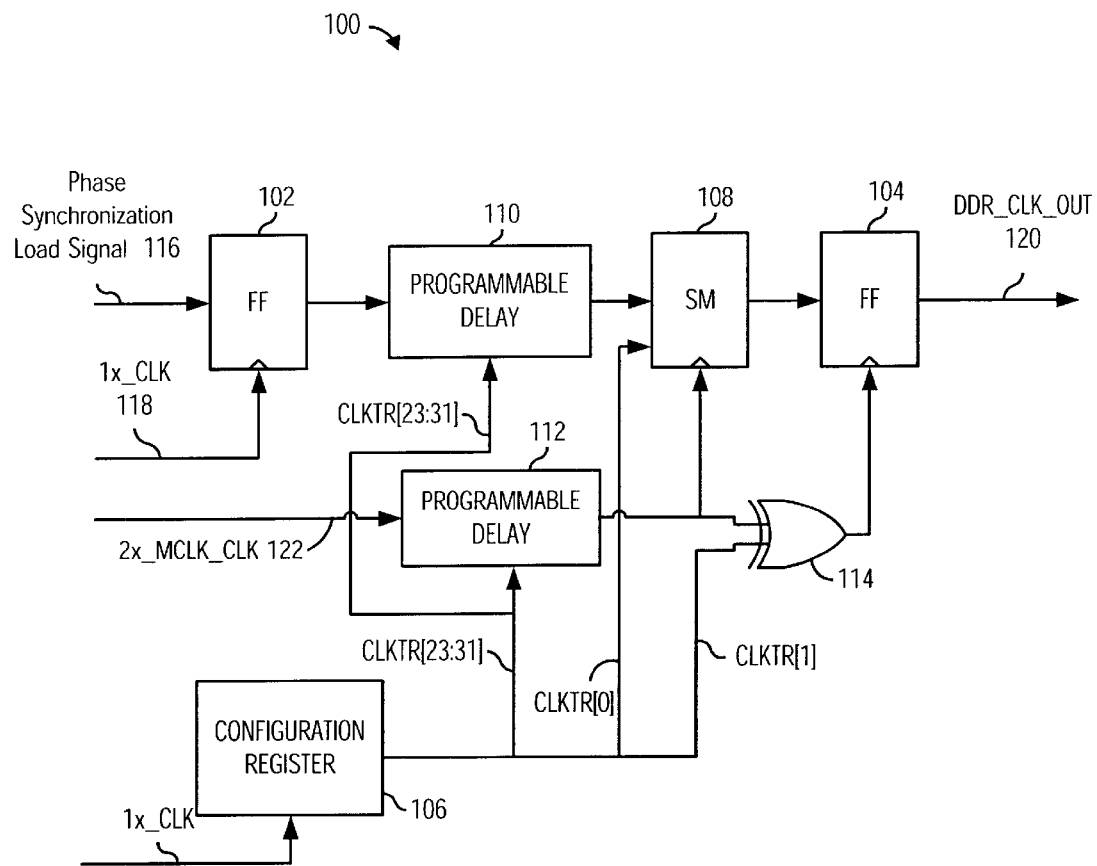
FIG. 1 depicts a block diagram of a memory clock generation logic.
Figure 2:
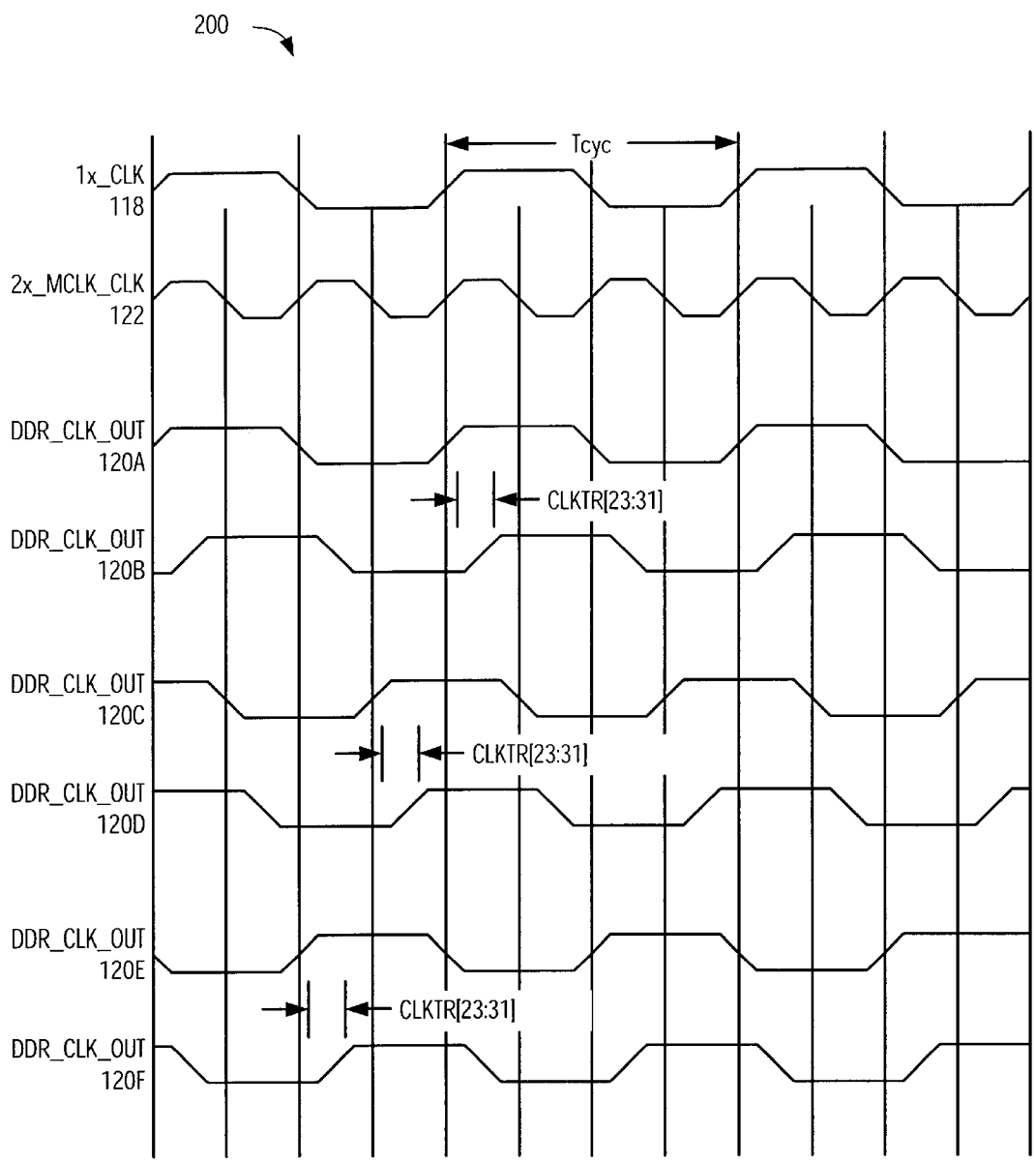
FIG. 2 depicts a timing diagram showing memory clock phase advance and delay.

The principles of the present invention and their advantages are best understood by referring to the illustrated operations of the embodiments depicted in FIGS. 1–2.

A preferred embodiment of the present invention is described in the memory clock generation logic circuit 100 as shown in FIG. 1. Preferably, the circuit 100 is implemented in a memory controller (not shown). The circuit 100 comprises two flip-flops (FFs) 102 and 104, a configuration register 106, a state machine (SM) 108, two programmable delays 110 and 112, and an XOR gate 114.

The FF 102 is configured for receiving the Phase Synchronization Load Signal 116 and the 1x_CLK 118 and for generating a timing signal that oscillates in the 1x_CLK domain. The 1x_CLK 118 is a clock signal of the same frequency as the memory controller internal clock frequency. The output of the FF 102 is connected to the input of the programmable delay 110, which is configured for accepting the timing signal from the FF 102 and a timing delay, referred to as the clock timing register (CLKTR [23:31]), from a configuration register 106, and for generating a delayed 1x_CLK timing signal. Preferrably, as indicated in FIGS. 1 and 2, the timing delay is specified in by the $23^{rd}$ through the $31^{st}$ bits of the configuration register 106, i.e., CLKTR[23:31]. While the present disclosure discusses the timing delay with reference to the $23^{rd}$ through the $31^{st}$ bits, it is given by way of example only and, therefore, should not limit the present invention in any manner. Furthermore, it is preferable that the value of CLKTR[23:31] represent the amount of delay desired in picoseconds.

The output of the programmable delay 110 is then connected to the input of the SM 108, which is configured to accept the delayed 1x_CLK timing signal from the programmable delay 110 and an indication of whether to shift the signal 180 degrees, and to provide a 0- or 180-degree phase shifted, delayed signal. Preferably, the indication of whether to shift the delayed timing signal 180-degrees is specified by the least significant bit of the configuration register, ie., CLKTR[0].

The programmable delay 112 is configured to accept a double-rate master clock signal, 2x_MCLK_CLK, and the timing delay, i.e., CLKTR[23:31], and to provide a delayed 2x_MCLK_CLK signal that is delayed the desired amount to the XOR 114. The XOR 114 is configured to accept the delayed 2x_MCLK_CLK and a 90-degree phase shift indication, and to provide a signal to the FF 104 that represents a 0- or 90-degree phase shift of the 2x_MCLK_CLK. Preferably, the 90-degree phase shift indication is provided in the second least significant bit of the configuration register 106, i e., CLKTR[1]. A shift of 90-degrees is preferably indicated by a bit value of 1 and a shift of 0 degrees, i.e., no shift, is indicated by a bit value of 0.

The output of the SM 108 is then connected to the input of the FF 104, which is configured to clock the 0- or 180-degree phase shifted, delayed signal according to the output of the XOR 114, generating a double data rate clock signal, DDR_CLK_OUT, 120. The DDR_CLK_OUT signal 120 represents the generated memory clock, which is equivalent in frequency to the memory controller internal clock (1x_CLK 118) frequency and derived from a clock (2x_MCLK_CLK 122) operating at twice the internal clock frequency. Since DDR and QDR memory controllers require the use of a double-speed clock frequency to manage the higher data rate transfers, the circuit 100 is applicable to such memory controllers.

It should be noted that the configuration register 106 generally comprises a plurality of flipflops to store configuration register bits. Typically, the number of the flip-flops (not shown) employed in a register determines the size of a register. For example, FIG. 1 illustrates a configuration register 106 that has 32 bits, and, therefore, the configuration register 106 would generally comprise of 32 FFs. The connection of the configuration register 106 to the programmable delays 110 and 112, and the XOR 114 will be known to one within the level of skill in the art upon a reading of the present disclosure, and, therefore, will not be discussed in greater detail herein.

As will be appreciated by one skilled in the art, substantially equivalent programmable delays 112 and 110 are inserted respectively in the 2x_MCLK_CLK domain and in the SM phase synchronization load input path. The XOR gate 114 and the control on the 2x_MCLK_CLK 122 that drives the FF 104 provides the 90 degree phase advance option as specified preferably in the CLKTR[1], whereas the SM 108 and phase synchronization load setup the relationship for 0- or 180-degree phase advance options. The use of the programmable delays 110 and 112 enable the fine-tuning delay adjustment as specified preferably in the CLKTR [23:31].

The control of the circuit is such that the configuration registers in 1x_CLK domain are programmed, then a 1x_CLK domain based timer decrements to allow for effect of the CLKTR[23:31] and CLKTR[1] settings to propagate and the delayed 2x_MCLK_CLK 122 to stabilize, then the phase synchronization load signal 116 is pulsed to load the programmed phase relationship.

The memory clock output DDR_CLK_OUT 120 can be used as input to an on-chip phase locked loop (PLL), driven off-chip directly to an external PLL, or used directly to clock the external memory as with any memory clock generation scheme.

FIG. 2 is a timing diagram 200 that depicts the DDR_CLK_OUT signal 120 as shown in FIG. 1 for various phase advance and delay combinations. Six DDR_CLK_OUT signals 120A–120F have been depicted for 0-, 90-, and 180-degree phase advance, and with or without phase delay for each phase advance. In the timing diagram 200, Tcyc indicates one cycle of the 1x_CLK clock signal 118. Each of the DDR_CLK_OUT signals 120A–120F represents the DDR_CLK_OUT signal 120 of FIG. 1, which is equivalent in frequency to the memory controller internal clock (1x_CLK 118) and derived from 2x_MCLK_CLK clock signal 122 operating at twice the internal clock frequency. CLKTR [0:1] is used to select a coarse phase advance while CLKTR [23:31] is used to program a delay adder to fine tune the memory clock timing relationship.

The DDR_CLK_OUT signal 120A has 0-degree phase advance and no phase delay. The configuration registers have the following values: CLKTR[0:1]=00; CLKTR[23:3 1]=000000000. Therefore, the DDR_CLK_OUT signal 120A is theoretically identical to 1x_CLK clock signal 118. Although some delays may occur in reality between 1x_CLK clock signal 118 and the DDR_CLK_OUT signal 120A, such delays have been ignored in FIG. 2 so as not to over complicate the illustration of the present invention. The DDR_CLK_OUT signal 120B has 0-degree phase advance and some phase delay. The configuration register CLKTR [0:1] has 00, whereas the configuration register CLKTR [23:31] has a non-zero value. The amount of the phase delay will be determined by the value of the configuration register CLKTR[23:31]. This enables fine-tuning of the phase delay by manipulating the value of the configuration register.

The DDR_CLK_OUT signal 120C has 90-degree phase advance and no phase delay. The configuration register CLKTR[0:1] has 01, whereas the configuration register CLKTR[23:31] has 000000000. The DDR_CLK_OUT signal 120D has 90-degree phase advance and some phase delay. The configuration register CLKTR[0:1] has 01, whereas the configuration register CLKTR[23:31] has a non-zero value.

The DDR_CLK_OUT signal 120E has 180-degree phase advance and no phase delay. The configuration register CLKTR[0:1] has 10, whereas the configuration register CLKTR[23:31] has 000000000. The DDR_CLK_OUT signal 120F has 180-degree phase advance and some phase delay. The configuration register CLKTR[0:1] has 10, whereas the configuration register CLKTR[23:31] has a non-zero value.

Therefore, the present invention allows for the adjustment of many aspects of the memory interface timings through the use of the configuration register bits CLKTR[0:1 ] and CLKTR[23:3 1] from the configuration register 106 as shown in FIG. 2. Such adjustments would be made based on the overall system timing budget of the specific application. In particular, the memory command interface setup time, hold time, and read data access time, as defined below, can be adjusted with the invention.

"Setup time" is defined generally as the minimum amount of time that valid write data strobe, data strobe, SDRAM command, and read data arrive prior to the arrival of the clock at the memory and/or memory controller (not shown) in order for the data or command to be sampled reliably by the memory device and/or memory controller. As mentioned above, the circuit 100 of FIG. 1 is preferably part of a memory controller. The present invention enables the setup time to be adjusted by enabling the user to change the arrival time of the referenced signals, such as write data strobe, data strobe and command. For example, if the required setup time on the referenced signals cannot be met, programmable delay lines such as the programmable delays 110 and 112 can be used to add delay to the memory clock such that it arrives later in time.

"Hold time" is defined generally as the minimum amount of time that write data, write data strobe, SDRAM command, and read data remain valid following the arrival of the clock at the memory and/or memory controller in order for the data or command to be sampled reliably by the memory device and/or memory controller. The present invention enables the hold time to be adjusted by enabling the user to change the arrival of the memory clock at the memory device with respect to the arrival of the referenced signals, such as write data strobe, data strobe, and command. For example, if the required hold time on the referenced signals cannot be met, the memory clock can be advanced such that the memory clock arrives sooner in time. In the case of a 90-degree phase advance, an additional ¼ clock cycle of hold time for the referenced signals is created.

"Read data access time" is defined generally as the maximum amount of time until the read data from an SDRAM device is driven valid by the device, after which it may be sampled by the memory controller. The present invention enables the effective read access time to be adjusted by enabling the user to change the arrival of the memory clock at the memory device. For example, the effective read access time can be reduced by ¼ clock cycle if the memory clock is advanced by 90-degrees. The access time of the device is fixed relative to the clock. If the clock arrives sooner, then the effective access time is reduced from the system timing budget perspective.

Therefore, a 0-degree phase advance with added programmed delay to the memory clock provides more setup time to the application at the expense of hold time and memory read data access time, the latter of which can be compensated for by using a separate memory read data clock.

Also, a 90- or 180-degree phase advance with or without programmed delay to the memory clock provides more hold time to the application at the expense of setup time. An added benefit of a phase advance on the memory clock, with respect to the controller read clock, is that it effectively provides improved synchronous memory access time by allowing "cycle stealing" to occur. Cycle stealing occurs when time is borrowed from one clock cycle and given to the next. The result, in case of memory, is a compressed Write clock cycle and an expanded Read clock cycle. DDR SDRAMs and QDR SRAMs employ source synchronous clocking on both the Read and Write paths. As such, a similar technique to the one disclosed herein can be applied to the source synchronous Write data interface to offset the Write clock cycle compression.

Additionally, the 90- and 180-degree phase advance options enable a class of applications that cannot use a PLL (on-chip or off-chip) in an effort to reduce system cost. The invention does so by allowing the user to configure the memory clock output to negate all or part of the insertion delay associated with an ASIC clock I/O driver and/or system board wiring.

Furthermore, the circuitry disclosed above may be used to enable logic/circuitry operating in one clock domain, such as the 1x_CLK domain, to interface to logic/circuitry operating in a second clock domain, such as the 2x_MCLK_CLK domain. This may be accomplished by varying or skewing the second domain with respect to, and independent of, the first domain while maintaining fully synchronous communication/operation.

For example, referring back to FIG. 1, if a programmable delay were only present on the 2x_MCLK_CLK domain, such as programmable delay 112, and no programmable delay were present on the Phase Synchronization Load Signal 116 control path, i.e., programmable delay 110 is removed, the synchronous communication between the two domains will only work up to the point that the skew of the 2x_MCLK_CLK does not exceed the "hold" time guaranteed by the output of the FF 102 on the 1x_CLK domain. By inserting an equivalent delay on the control path via the programmable delay 110, however, the "relative" timing for the control path from the 1x_CLK domain to the logic clocked by the 2x_MCLK_CLK domain remains constant, even as the relationship between the domains is varied (increased or decreased) by the programmable delay.

As one skilled in the art will appreciate, the addition of the programmable delay enables a tuning capability that is independent of any aspect of the implementation, such as the frequency, frequency relationship, and the like. Furthermore, the disclosed invention provides the ability to generate and adjust the arrival of any signal on a "variable" clock domain relative to a fixed clock domain without the need for more complex/sophisticated clock domain synchronization logic.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A memory clock generation logic circuit comprising:
    a configuration register configured for generating configuration register bits and driven by a memory controller internal clock signal;
    a first programmable delay configured for receiving a double-speed clock signal and generating from the double-speed clock signal a phase-delayed double-speed clock signal and connected to the configuration register for receiving a first part of the configuration register bits from the configuration register, the amount of the phase delay of the double-speed clock signal being determined by the first part of the configuration register bits received by the first programmable delay;
    a second programmable delay connected to a first flip-flop (FF) for receiving a phase synchronization load signal through the first FF and to the configuration register for receiving the first part of the configuration register bits from the configuration register, the second programmable delay outputting a phase-delayed phase synchronization load signal, the amount of the phase delay of the phase synchronization load signal being determined by the first part of the configuration register bits, the first FF being driven by the memory controller internal clock signal; and
    a state machine connected to the second programmable delay for receiving the phase-delayed phase synchronization load signal from the second programmable delay, and having its output connected to the input of a second FF, the state machine being driven by the phase-delayed double-speed clock signal, the second FF being driven by an XOR gate receiving the phase-delayed double-speed clock signal from the first programmable delay and a second part of the configuration register bits from the configuration register, the second FF being configured for outputting a generated memory clock signal.

2. The memory clock generation logic circuit of claim 1, wherein the XOR gate is configured for providing a 90 degree phase advance option of the generated memory clock signal, wherein the state machine and the phase synchronization load signal setup the relationship for a 0 or 180 degree phase advance option of the generated memory clock signal, and wherein the first and second programmable delay enables a fine tuning delay option of the generated memory clock signal.

3. The memory clock generation logic circuit of claim 1, wherein the XOR gate is configured for providing a 90 degree phase advance option of the generated memory clock signal by adjusting the second part of the configuration register bits, wherein the state machine and the phase synchronization load signal setup the relationship for a 0 or 180 degree phase advance option of the generated memory clock signal by adjusting the first part of the configuration register bits, and wherein the first and second programmable delay enables a fine tuning delay option of the generated memory clock signal.

4. The memory clock generation logic circuit of claim 1, wherein the generated memory clock signal is input to an on-chip Phase Locked Loop (PLL) circuit.

5. The memory clock generation logic circuit of claim 1, wherein the generated memory clock signal is driven off-chip directly to an external PLL.

6. The memory clock generation logic circuit of claim 1, wherein the generated memory clock signal is output directly to an external memory.

7. The memory clock generation logic circuit of claim 1, wherein the first and second programmable delays are substantially identical.

8. The memory clock generation logic circuit of claim 1, wherein the logic value of the second part of the configuration register bits is set to 0, thereby connecting the output of the first programmable delay directly to the input of the second FF.

9. The memory clock generation logic circuit of claim 1, wherein the logic value of the first part of the configuration register bits is set to 0.

10. The memory clock generation logic circuit of claim 1, wherein the state machine is connected to the configuration register for receiving a third part of the configuration register bits from the configuration register.

11. The memory clock generation logic circuit of claim 1, wherein the state machine is connected to the configuration register for receiving a third part of the configuration register bits from the configuration register, and wherein the logic value of the third part of the configuration register bits is set to 0.

12. A method of generating a memory clock, comprising:

outputting configuration register bits from a configuration register driven by a memory controller internal clock signal;

inputting a double-speed clock signal to a first programmable delay configured for outputting a phase-delayed double-speed clock signal and connected to the configuration register for receiving a first part of the configuration register bits from the configuration register, the amount of the phase delay of the double-speed clock signal being determined by the first part of the configuration register bits received by the first programmable delay;

inputting a phase synchronization load signal to a first flip-flop (FF) connected to a second programmable delay for transmitting the phase synchronization load signal to the second programmable delay connected to the configuration register for receiving the first part of the configuration register bits from the configuration register, the second programmable delay outputting a phase-delayed phase synchronization load signal, the amount of the phase delay of the phase synchronization load signal being determined by the first part of the configuration register bits, the first FF being driven by the memory controller internal clock signal;

inputting the phase-delayed phase synchronization load signal to a state machine connected to the input of a second FF, the state machine being driven by the phase-delayed double-speed clock signal, the second FF being driven by an XOR gate receiving the phase-delayed double-speed clock signal from the first programmable delay and a second part of the configuration register bits from the configuration register; and generating a memory clock signal from the second FF.

13. The method of claim 12, wherein the XOR gate is configured for providing a 90 degree phase advance option of the generated memory clock signal, wherein the state machine and the phase synchronization load signal setup the relationship for a 0 or 180 degree phase advance option of the generated memory clock signal, and wherein the first and second programmable delay enables a fine tuning delay option of the generated memory clock signal.

14. The method of claim 12, wherein the XOR gate is configured for providing a 90 degree phase advance option of the generated memory clock signal by adjusting the second part of the configuration register bits, wherein the state machine and the phase synchronization load signal setup the relationship for a 0 or 180 degree phase advance option of the generated memory clock signal by adjusting the first part of the configuration register bits, and wherein the first and second programmable delay enables a fine tuning delay option of the generated memory clock signal.

15. The method of claim 12, wherein the memory clock signal is input to an on-chip Phase Locked Loop (PLL) circuit.

16. The method of claim 12, wherein the memory clock signal is driven off-chip directly to an external PLL.

17. The method of claim 12, wherein the memory clock signal is output directly to an external memory.

18. The method of claim 12, wherein the first and second programmable delays are substantially identical.

19. The method of claim 12, wherein the logic value of the second part of the configuration register bits is set to 0, thereby connecting the output of the first programmable delay directly to the input of the second FF.

20. The method of claim 12, wherein the logic value of the first part of the configuration register bits is set to 0.

21. The method of claim 12, further comprising the step of transmitting a third part of the configuration register bits from the configuration register to the state machine.

22. The method of claim 12, further comprising the step of transmitting a third part of the configuration register bits from the configuration register to the state machine, wherein the logic value of the third part of the configuration register bits is set to 0.

* * * * *